United States Patent [19]

Johnson et al.

[11] 4,128,893

[45] Dec. 5, 1978

[54] METHOD OF AND DEVICE FOR ANALYZING PERFORMANCES IN ATHLETIC EVENTS

[75] Inventors: Eugene C. Johnson, 5719 Newington Rd., Bethesda, Md. 20016; Frederick F. Dalessio, Aston, Pa.

[73] Assignee: Eugene C. Johnson, Bethesda, Md.

[21] Appl. No.: 759,251

[22] Filed: Jan. 13, 1977

[51] Int. Cl.² ............................................. G06F 1/00
[52] U.S. Cl. .................................................. 364/900
[58] Field of Search ................ 364/900 MS File, 410; 235/168, 92 GA, 92 CP, 92 AC; 273/29 R, 31; 35/29 R

[56] References Cited

U.S. PATENT DOCUMENTS

| | | | |
|---|---|---|---|
| 3,784,802 | 1/1974 | Imai et al. | 235/168 |
| 4,003,030 | 1/1977 | Takagi et al. | 364/900 |
| 4,019,174 | 4/1977 | Vanderpool et al. | 364/900 |

*Primary Examiner*—Raulfe B. Zache

*Attorney, Agent, or Firm*—Lowe, King, Price & Becker

[57] ABSTRACT

A portable, battery operated storage device for analyzing performances in athletic events, such as tennis, includes an electronic random access memory controlled by a keyboard, and a digital display. The memory contains individual storage locations corresponding to points earned and points lost for each play. In addition, up/down counters in the device accumulate total points gained and lost for all plays. The player or spectator keyboard enters data identifying each play and indicating whether a point was gained or lost. Points lost and points gained data for each play are stored in corresponding storage locations in the memory. Total points gained and lost are stored in the counters. After the game, the numbers of points gained and lost for each play are determined by accessing the memory and displaying the contents of each of the storage locations on the digital visual readout. Total points gained and lost are determined by displaying the contents of the counters.

17 Claims, 6 Drawing Figures

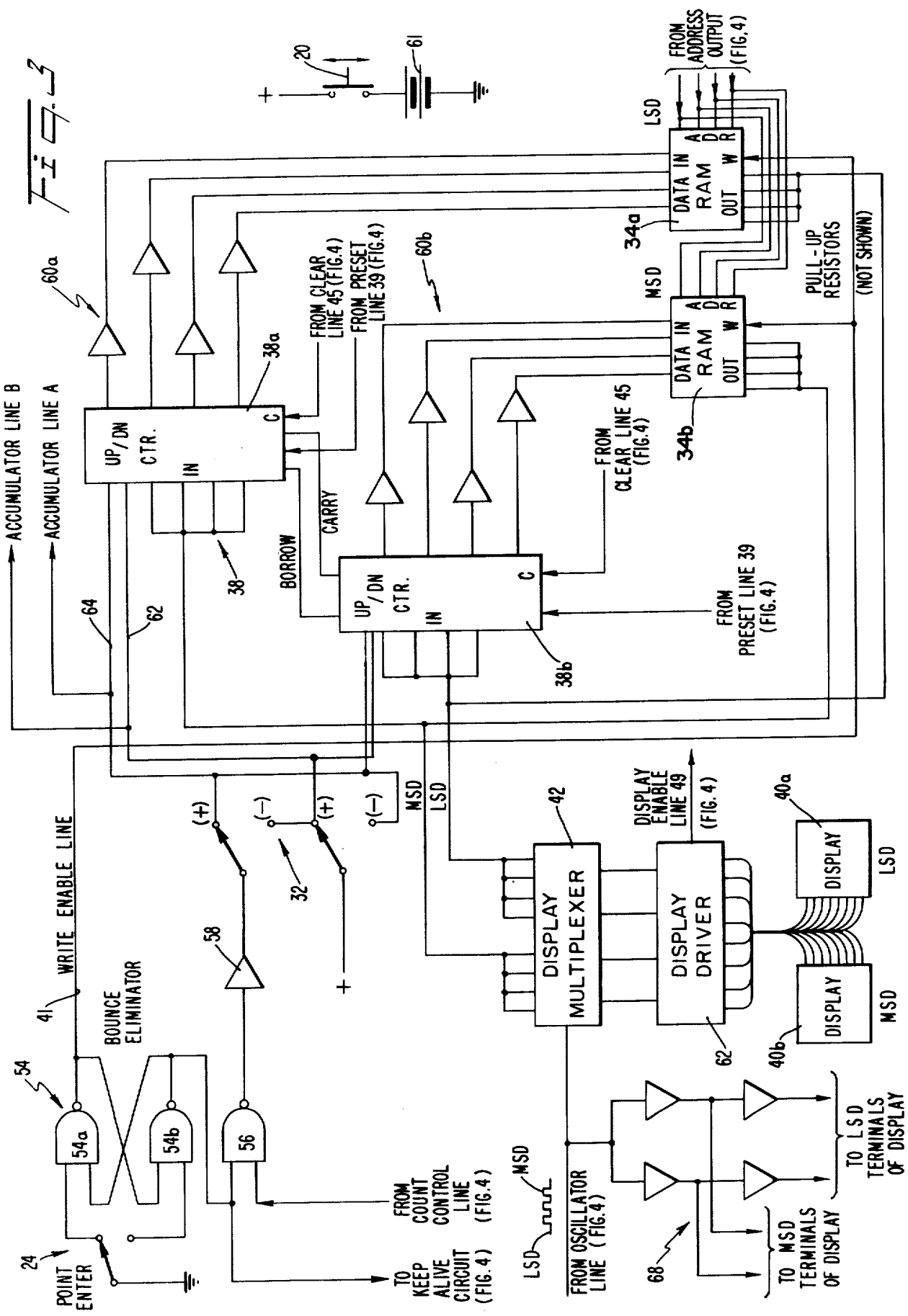

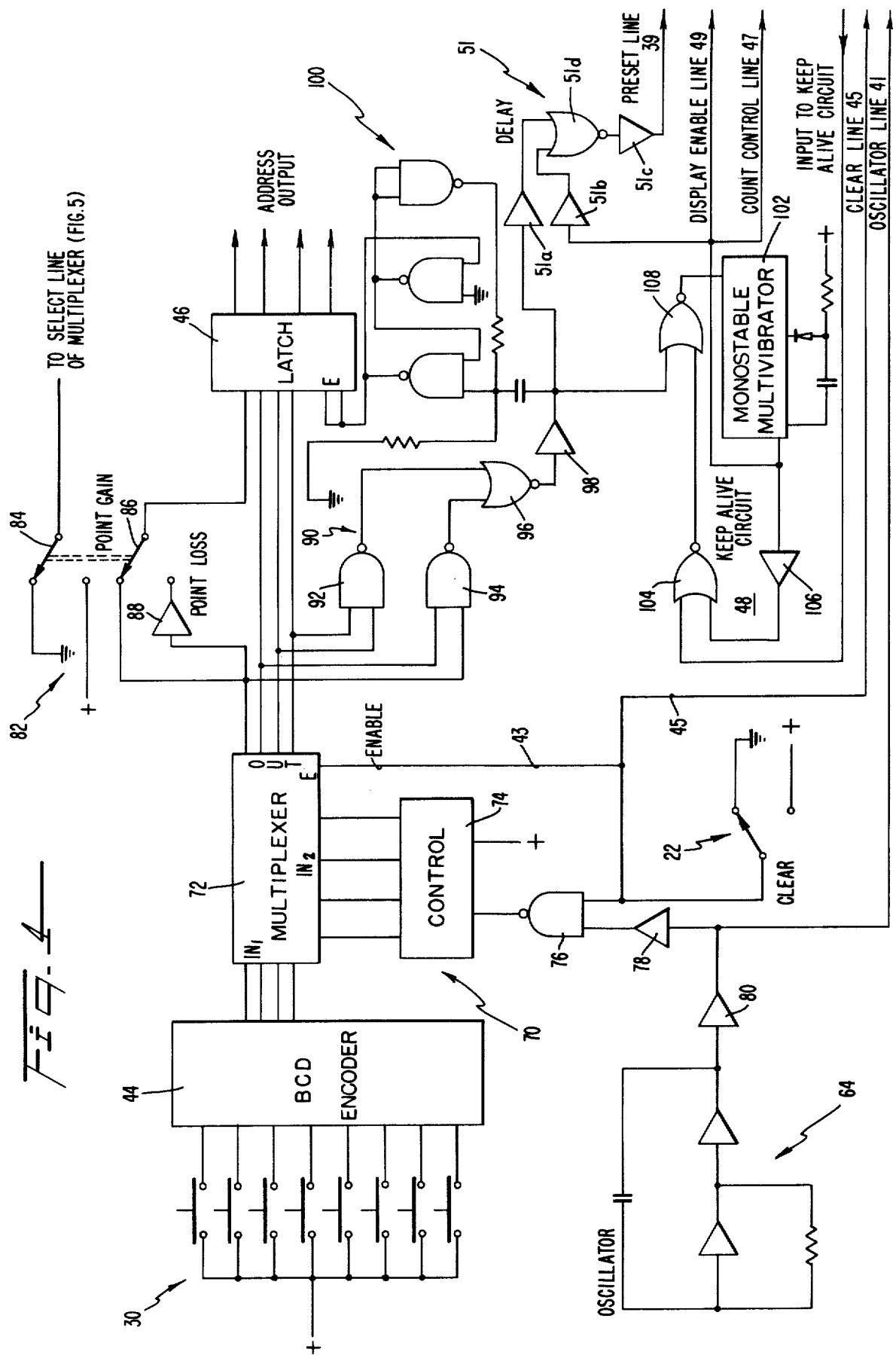

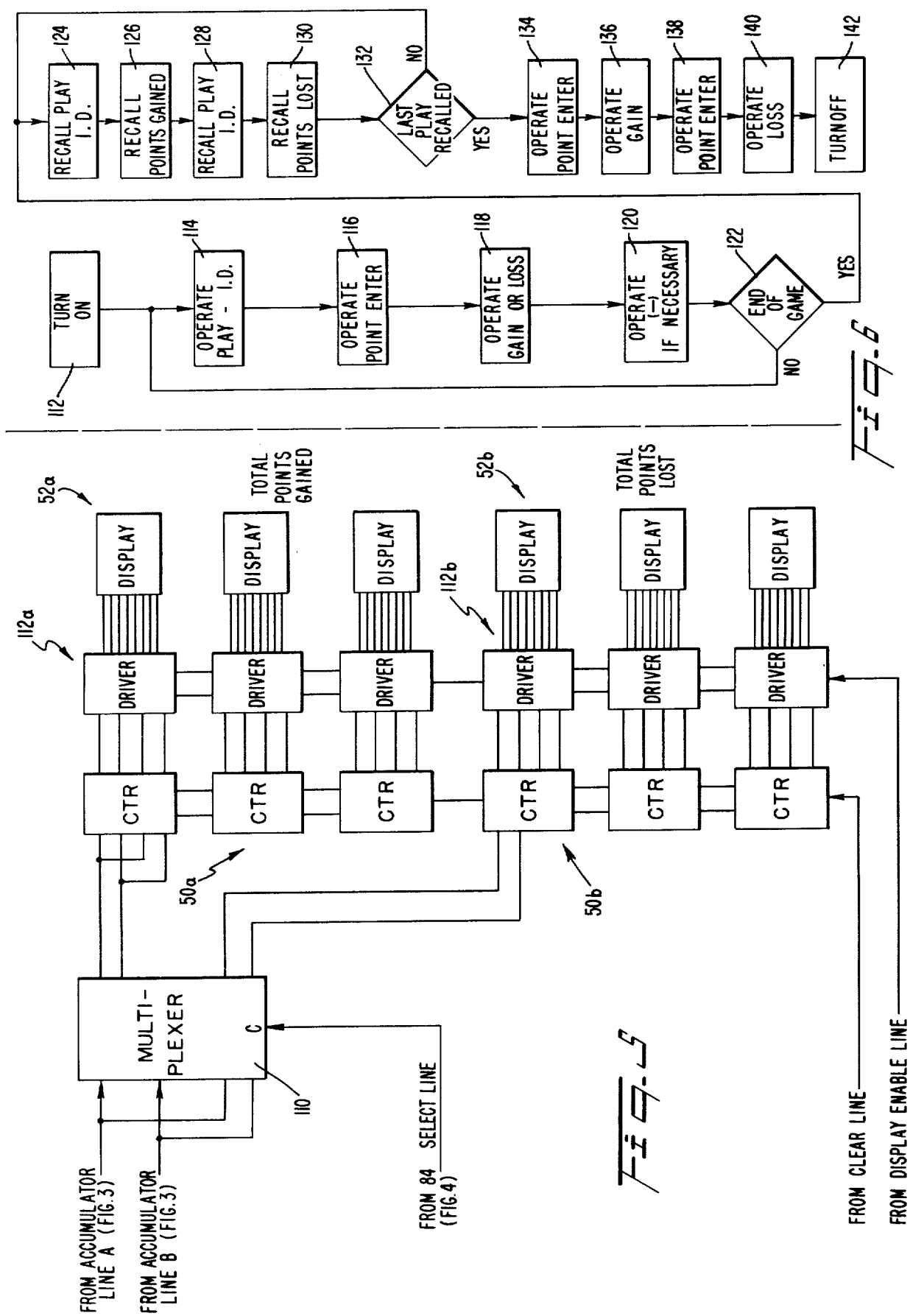

METHOD OF AND DEVICE FOR ANALYZING PERFORMANCES IN ATHLETIC EVENTS

BACKGROUND OF THE INVENTION

The present invention relates generally to data loggers, and more particularly, toward a battery operated, portable device for storing data relating to athletic events, wherein stored data are subsequently readout for analysis and evaluation.

In athletic events, such as tennis, a number of different types of plays are made in order to accumulate points. For example, in tennis, the ball can be played in any of several ways, such as:

First Serves
Aces/Double Faults
Forehand
Backhand
Volley
Overhead

At the end of each game, statistics are generally compiled indicating the number of points gained and lost for each of the plays identified above. These statistics enable spectators to evaluate the performance of each player, as well as enable each player to evaluate his own performance and identify areas for improvement.

In public tournaments, performance data are generally recorded by spectators and officials using pencil and paper. Pencil and paper, however, are unsuitable for private matches wherein the players would have to record their own performances. The game must be temporarily suspended after each play in order to make an entry. There exists a need for a system of recording player performance in athletic events by recording performance data in a device that can be carried by the players and operated during the game.

Accordingly, it is a general object of the invention to provide a method of and system for logging data in accordance with particular categories, and accessing the data accumulated in each category for analysis.

Another object is to provide a method of and system for storing data in accordance with particular categories in a portable storage device and subsequently reading out the data stored in each category for evaluation.

A more specific object is to provide a method of and apparatus for logging performance data during athletic events for subsequent evaluation.

Another object is to provide a method of and device for storing points earned and lost with respect to each of a number of particular plays during an athletic event and subsequently reading out the total number of points gained and lost in each category.

Still another object is to provide a method of and system for storing points gained and lost in each of a number of plays during an athletic event, and subsequently reading out points gained and lost in each category as well as total points gained and lost.

SUMMARY OF THE INVENTION

Briefly, a battery operated, portable data logging device for a variety of applications, such as analyzing performances in athletic events, comprises an electronic circuit contained in a plastic, shock-resistant case that is mountable to the wrist or belt of a player. The device includes a key-board having a series of recessed keys to prevent unintentional operation of the device during playing, and a visual readout, such as a nixie tube display, liquid crystal display (LCD) or light emitting diode (LED) display. The device contains a solid state random access memory (RAM), controlled by the keyboard, having a plurality of storage locations corresponding to particular plays identified on the keys. Logic circuitry inside the device directs storage of points earned and lost for each play into corresponding storage locations in the memory.

Counters are also provided in the device for accumulating total points gained and lost during the game. After the game, the player or spectator can thus read out total points gained and lost from the counters as well as subtotal points gained and lost for each type of play from the random access memory.

The keyboard contains a key for entering points played, and keys for distinguishing between a point gained and a point lost. In addition, a separate key is provided for each of a number of identified plays such as backhand, forehand, etc., as well as for clearing the memory.

The keys for identifying the plays generate signals that are supplied to a binary encoder which generates a unqiue encoded signal corresponding to each play. The encoded signal is supplied to a latch which stores the signal to permit the player to keyboard enter several sets of point data. The output of the latch is supplied to the address inputs of the random access memory so that subsequently entered data are stored in the memory at storage locations addressed by the play identification keys. Two distinct storage locations in the memory are assigned to each play: one storage location for points gained and one storage location for points lost. The memory thus requires 2N four-bit storage locations where N = number of plays identified on the keyboard.

In the preferred embodiment, two 64 bit RAMs are provided for storage of two-digit data associated with eight identified plays. The output of each memory is connected to an up/down counter. Each time storage locations in the two memories are addressed, data are transferred from the memories respectively to the two counters. A point entry signal, entered at the keyboard, increments the up/down counters and recirculates the incremented point data back into the addressed storage locations in the memories. Alternatively, the point data in the memories are decremented by operating a (−) key on the keyboard. The (−) key generates a control signal to the counters which causes the data in the addressed storage locations in the memories to be decremented and recirculated.

An additional pair of up/down counters are provided for accumulating respectively total points gained and lost, that is, the sum of points gained during each play and the sum of points lost for each play. The total points gained or lost are displayed each time there is a display of subtotal points gained and lost in each play category. Total points are read out through a three digit display adjacent the two digit, subtotal display.

The random access memories are rest to zero at the start of a game by manually operating the reset (clear) key on the keyboard. The reset key controls a two-input multiplexer provided between the play identification encoder and the latch. One input of the multiplexer is connected to the encoder and the remaining input is connected to a counter. The counter is caused to count at high speed by an oscillator circuit so that the counter output generates successively increasing address data. During data entry, the output of the multiplexer passes keyboard entered address data from the encoder to the latch. During reset, however, the multiplexer passes the counter generates signal to the latch. The counter generated signal successively resets all storage locations in the memories to zero.

A keep alive circuit is activated each time to a point play or point address is entered on the keyboard. The keep alive circuit permits the memories and counters to receive point data, and enables the display for a predetermined period of time.

In operation, the user turns on the device using an on/off key on the keyboard at the start of a game. The on/off switch applies battery power to the memories, display and logic circuitry. All storage locations in the memories are reset to zero by the user by manually operating the reset key. At the end of each play, the user enters the particular play into the device by operating one of the play identification keys. Then, the user operates the point enter and either the point gained or point lost key. This procedure is repeated following each play during the game.

Following completion of the game, the user analyzes player performance by successively accessing each storage location in the memories in order to determine the number of points gained and lost for each play. Access to each storage location is made by successively operating the desired play identification key and points gained or points lost key. The total points gained and lost may be separately determined by successively operating the point entry key and points gained or lost key. Total points gained and lost are displayed at opposite sides of the screen.

Accordingly, another object of the invention is to provide an electronic device having a plurality of storage locations controlled by a keyboard and corresponding to particular plays, wherein keyboard entered point data are stored in storage locations associated with the plays.

Another object is to provide an electronic device, wherein points gained and lost are stored in separate storage locations associated with each of a plurality of play categories in a random access memory.

Still another object is to provide an electronic storage device that can be worn by a player for storing points gained and lost for each of a plurality of identified plays into corresponding storage locations in a random access memory as well as storing total points gained and lost data for subsequent performance evaluation.

Yet another object of the invention is to provide a battery operated, portable electronic storage device that can be worn by a player, wherein performance data for each of a plurality of plays are stored in a random access memory and which can be accessed at any time for complete performance evaluation.

Still other objects, advantages and features of the present invention will become readily apparent to those skilled in this art from the following detailed description, wherein I have shown and described only the preferred embodiment of the invention, simply by way of illustration of the best mode contemplated by me of carrying out our invention. As will be realized, the invention is capable of other and different embodiments, and its several details are capable of modifications in various obvious respects. Accordingly, the drawings and description are to be regarded as illustravtive in nature, and not as restrictive.

BRIEF DESCRIPTION OF THE DRAWINGS

FIGS. 3-5 are schematic digrams of a circuit for implementing the system shown in FIG. 2; and FIG. 6 is a flow diagram illustrating the operation of the device.

DETAILED DESCRIPTION OF THE PREFERRED EMBODIMENT

Figure 1:
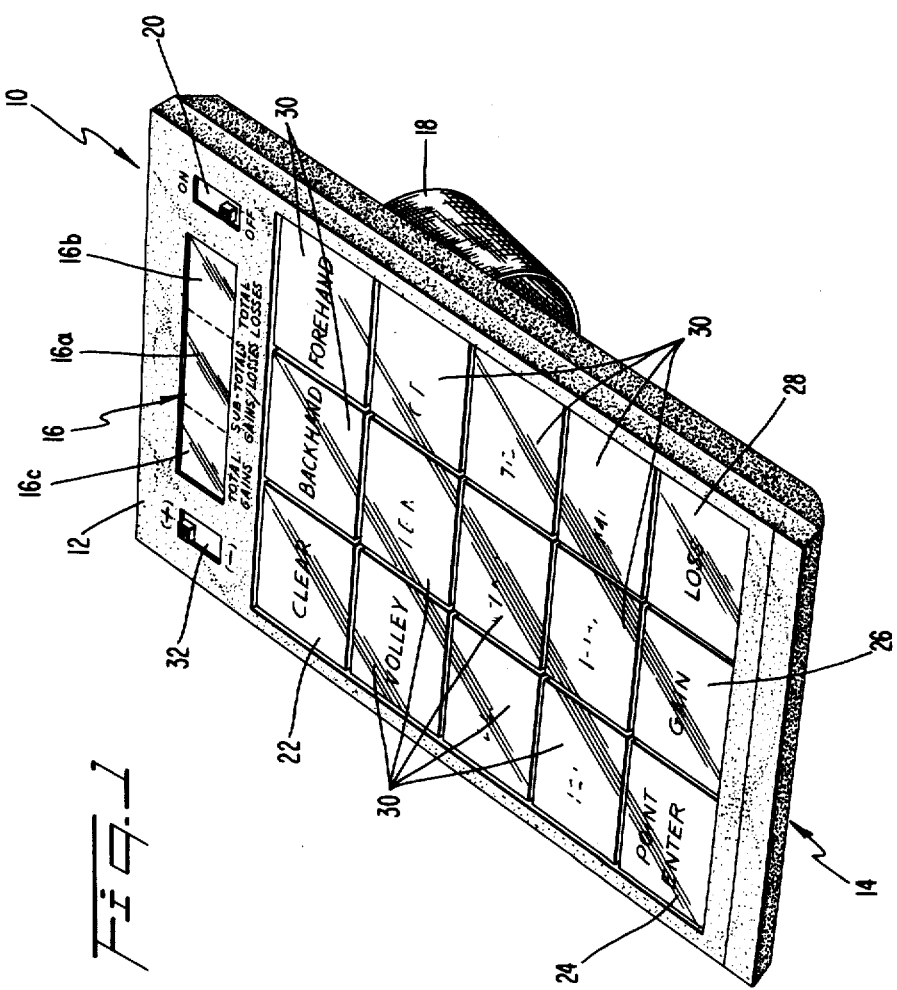
FIG. 1 is a perspective view of an electronic storage device in accordance with the invention, including a strap for mounting the device to the body of a player.

Referring to FIG. 1, a portable, battery operated electronic storage device 10 for logging tennis player performance data comprises a shock-resistant, molded plastic case 12 containing a keyboard 14 and a display 16 as well as a battery operated power supply and electronic circuitry, described in FIGS. 3-5. A band 18 is attached to the backside of the case 12 to permit the device 10 to be worn on the wrist or belt, for example, of the tennis player. Also located on the case 12 is an on/off switch 20 which controls the application of battery power to the circuitry and display 16 of the device 10.

Keyboard 14 comprises a plurality of keys, such as CLEAR key 22, which are recessed below the surface of case 12, as shown, to prevent unintentional operation of the keyboard during playing. Keyboard 14 includes, in addition to CLEAR key 22, a POINT ENTER key 24, a POINT GAIN key 26, a POINT LOSS key 28 and a series of PLAY IDENTIFICATION keys 30, such as BACKHAND, FOREHARD and VOLLEY.

In accordance with the invention, following each play during a game or practice, the player or spectator identifies the play by operating an appropriate PLAY IDENTIFICATION key 30. The player or spectator then operates the POINT ENTER key 24 and indicates whether the point was gained or lost by operating respectively GAIN key 26 or LOSS key 28.

An (+)/(−) switch 32 is provided to subtract points entered through keyboard 14 from previously entered points. Switch 32 is normally retained in the (+) position as shown in FIG. 1, wherein points entered are successively added to points previously entered associated with each play. When switch 32 is located in the (−) position, points entered are subtracted from the points previously entered.

After a game has been completed, or during the game if desired, the number of points gained or lost for each play is displayed on screen 16 by operating successively one of the PLAY IDENTIFICATION keys 30 and then GAIN key 26 or LOSS key 28. These numbers (play subtotals) are displayed on central portion 16a of display screen 16. The total number of points gained or lost is also displayed on screen 16 by successively operating POINT ENTER key 24 and the GAIN key 26 or LOSS key 28. The total points gained are displayed at side 16c of the screen 16, and the total points lost are displayed at the opposite side 16b. As described in detail below, each time a points gained subtotal or points lost subtotal for a play is displayed in screen portion 16a, total points gained or lost, respectively, are simultaneously displayed on portion 16c or 16b of display screen 16. By reading out the performance data stored in device 10, a complete set of statistics on a player's performance can be obtained and the player or spectator can identify strong and weak areas in the player's game.

Figure 2:
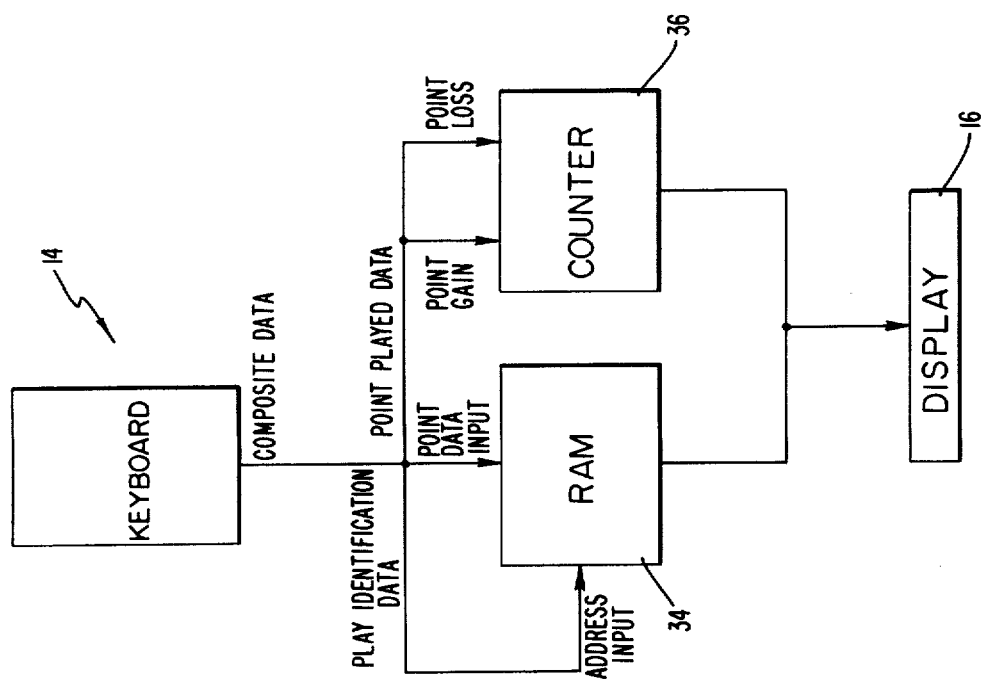
FIG. 2 is a simplified block diagram of an electronic circuit used in the device shown in FIG. 1.

Referring to FIG. 2, a simplified block diagram of the electronic circuitry contained in device 10 is shown. Keyboard 14 generates signals corresponding to sets of data each of which includes (1) point played data generated by POINT ENTER key 24, (2) play identification data generated by one of the PLAY IDENTIFICATION keys 30 as well as (3) point gained or point lost data generated by GAIN key 26 or LOSS key 28. The point played data are stored in predetermined storage locations within a random access memory (RAM) 34. These storage locations are identified by the play identification and point gained/lost data. The point played data are also supplied to a counter 36 for storage of total points gained and lost. The outputs of RAM 34 and counter 36 are supplied to predetermined portions of display 16.

Of particular importance, the point data, generated by POINT ENTER key 24, are supplied to the data input of RAM 34, and the play identification data generated by PLAY IDENTIFICATION keys 30 as well as by GAIN key 26 and LOSS key 28 are supplied to the address inputs of RAM 34 addressed by the PLAY IDENTIFICATION and GAIN/LOSS keys. Each storage location represents points gained or lost with respect to a particular one of the plays identified by keys 30; two storage locations are provided in correspondence to each identified play category. Each location has stored therein number data indicative of accumulated points. Assuming that provision is made for storing points gained and lost data with respect to eight plays, as shown in FIG. 1, RAM 34 contains 16 storage locations. Each storage location stores a four-bit BCD word, calling for 64 bits of storage.

Referring now to FIGS. 3-5, circuitry for operating the storage device 10 shall be described in detail. As an overview, however, point data entered at POINT ENTER switch 24 (FIG. 3) are supplied to the data inputs of RAM 34a and RAM 34b corresponding respectively to the more significant digit (MSD) and the less significant digit (LSD) in a two-digit number. The point data entered through switch 24 are supplied to RAMs 34a and 34b through a pair of up/down counter circuits 38a and 38b, also corresponding respectively to the more and less significant digits. Counters 38a and 38b are controlled by (+)/(−) switch 32 to selectively increment or decrement the contents of each storage location in the RAMs 34a, 34b. The outputs of the RAMs 34a and 34b are supplied to a pair of displays 40a and 40b; the contents of the RAMs 34a and 34b are alternately supplied at a high sampling rate to the displays 40a and 40b through a display multiplexer 42 to avoid any display screen flicker.

Storage locations in the RAMs 34a and 34b are addressed by the outputs of PLAY IDENTIFICATION switches 30 (FIG. 4) which are encoded into BCD by an encoder 44. The output of encoder 44 is temporarily stored in a latch 46. The output of latch 46 generates an addressing signal for addressing storage locations in RAMs 34a and 34b.

The POINT ENTER data generated by switch 24 are also accumulated in counter circuits 50a and 50b (FIG. 5). Counter circuit 50a accumulates points gained and counter 50b accumulates points lost. The outputs of counters 50a and 50b are selectively supplied to displays 52a and 52b viewable through opposite sides of the display screen 16 as shown in FIG. 1.

Referring now to FIGS. 3-5 in more detail, and referring first to FIG. 3, POINT ENTER switch 24, which corresponds to POINT ENTER key 24 in FIG. 1, is a SPST momentary switch spring biased in the position shown in FIG. 3. The output of POINT ENTER key 24 is supplied to a conventional switch bounce eliminator circuit 54, comprising a pair of cross-coupled NAND gates 54a and 54b. The output of gate 54 is a write enable signal that is supplied to the write enable control terminals W of RAMs 34a and 34b. When POINT ENTER switch 24 is operated, RAMs 34a and 34b store data applied to data input terminals DATA IN into storage locations identified by data supplied to the address terminals ADR.

A complementary output of switch bounce eliminator circuit 54, taken from the output of gate 54b, is supplied to the input of a KEEP ALIVE circuit 48 (FIG. 4) as well as to one input of a two-input NAND gate 56 (FIG. 3). The remaining input of NAND gate 56 is connected to a count control line at the output of KEEP ALIVE circuit 48, described in more detail below. The output of the NAND gate 56 is supplied to the input of up/down counters 38a and 38b through (+)/(−) switch 32 and inverter 58.

The purpose of inverter 58 is simply to produce a logic inversion required for proper operation of up/down counters 38a and 38b. Switch 32 controls the operation of the up/down counters 38a and 38b, that is, the switch determines whether data already stored in the counters are incremented or decremented in response to operation of the POINT ENTER switch 24. The (+)/(−) switch 32 is normally in the (+) position shown, whereby a positive voltage from battery 60 is supplied to line 62 while the data output of inverter 58 is supplied to line 64 so as to increment the contents of counters 38a and 38b. On the other hand, when switch 32 is placed in the (−) position, the positive voltage from battery 60 is supplied to line 64 while the output of inverter 58 is supplied to line 62 for decrementing the contents of counters 38a and 38 b.

As described below, the purpose of counter 38 is to update data in RAMs 34a and 34b by temporarily storing the outputs of the RAMs 34a and 34b in the counter, incrementing or decrementing the data stored in the counter and supplying the incremented or decremented data back into the RAMs for updating. The output of up/down counter 38a is connected to RAM 34a. As mentioned above, the point data are stored for each play in a two digit number; the less significant digit is stored in RAM 34a and updated by counter 38a. Correspondingly, the more significant digit is stored in RAM 34b and updated by counter 38b.

Each of the RAMs 34a and 34b contains 64 bits of storage capable of storing 16 four-bit words addressed by a unique four-bit code supplied to address input ADR. Upon application of an address signal to terminals ADR along with application of a write enable signal to terminals W, data supplied to the DATA IN terminals are stored in the addressed storage location.

The address terminals ADR in RAMs 34a and 34b are connected in parallel so that each receives a common address signal. Accordingly, an address signal applied to the address lines by latch 46 (FIG. 4) is supplied to both of the RAMs 34a and 34b. If, corresponding to a BACKHAND play identified by code 1010, example, 12 points gained have been accumulated, the word 0001, corresponding to the more significant digit 1 is stored in RAM 34b at address location 1010 and the word 0010 corresponding to the less significant digit 2 is stored in address location 1010 of RAM 34a.

The input terminals IN of up/down counters 38a and 38b are connected respectively to the output terminals OUT of RAMs 34a and 34b. Each time a point is entered at POINT ENTER switch 24, as described in more detail below, a preset signal is supplied to the counters 38a and 38b along a preset line 39 (see also FIG. 4) whereby the counters 38a and 38b assume the instantaneous states of the addressed storage locations in RAMs 34a and 34b. The data stored in the counters 38a and 38b are then incremented or decremented, depending on the state of the (+)/(−) switch 32, in response to operation of POINT ENTER switch 24.

The updated data in up/down counters 38a and 38b are supplied to the RAMs 34a and 34b through sets of inverters 60a and 60b. The inverters 60a and 60b provide polarity inversion necessary for driving the data input terminals DATA IN of the RAMS 34a and 34b. RAMs 34a and 34b receive the data supplied by counters 38a and 38b in response to a write enable signal generated by bounce eliminator circuit 54 onto line 41 and applied to write enable terminals W.

The outputs of RAMs 34a and 34b are also supplied to displays 40a and 40b. The two-digit outputs of RAMs 34a and 34b are displayed on display screen 16 at portion 16a (FIG. 1) by driving displays 40a and 40b with display driver 62 controlled by multiplxer 42. Multiplexer 42 alternately transfers data from the outputs of RAMs 34a and 34b respectively to displays 40a and 40b through driver 62. The frequency at which output data is alternated between displays 40a and 40b, controlled by a clock signal generated by oscillator 64 (FIG. 4) is high enough to prevent any appearance of flicker on display screen 16. Also driven by the output of the oscillator 64 are cathode drivers 68 which provide ignition current for the display digits.

The outputs of switches 30 are supplied to a 10 line-to-one line BCD encoder 44 which generates a unqiue BCD code corresponding to each of the eight PLAY SELECTION keys 30, shown in FIG. 1 (two input lines are unused). The output of BCD encoder 44 is supplied to latch 46 for temporary storage. Between encoder 44 and latch 46 is a CLEAR circuit 70 comprising a multiplexer 72, a COUNTER 74 and an oscillator 64, as well as NAND gate 76 and inverters 78 and 80. The reset or clear circuit is controlled by a SPST switch 22 corresponding to CLEAR key 22 in FIG. 1.

As described above, the output of latch 46 supplies address data for RAMs 34a and 34b. Storage locations in the RAMs 34a and 34b are addressed by the output of BCD encoder 44 through the latch 46. In the example discussed above, BCD encoder 44 generates a code 1010 when switch 30 is located in a position corresponding to BACKHAND. This corresponds to an operation BACKHAND key 30 in FIG. 1. The code 1010 is temporarily stored in latch 46 and supplied to the address terminals ADR of RAMs 34a and 34b. Latch 46 is controlled to accept new address data each time one of the PLAY IDENTIFICATION keys 30 is operated by logic circuit 90 and pulse generator circuit 100, described in detail below.

Oscillator 64 which is conventional, generates a relatively high frequency clock signal. The output of oscillator 64 is supplied to the input of counter 74 through inverters 78 and 80 as well as to one input of two-input NAND gate 76, and to oscillator line 41. The remaining input of NAND gate 76 is controlled by CLEAR switch 22. When CLEAR switch 22 is grounded, as shown in FIG. 4, no clock signal is applied to counter 74. When CLEAR switch 22 is indexed to (+), however, the remaining input of NAND gate 76 receives a positive voltage and the clock signal passes through the NAND gate 76 to counter 74.

As mentioned above, one set of data input terminals of multiplexer 72 is connected to the output of encoder 44. The remaining set of data input terminals $IN_2$ is connected to the output of counter 74. When enable terminal E of the multiplexer 72 is connected to ground by CLEAR switch 22, the multiplexer passes data between $IN_1$ and OUT (address data). On the other hand, when enable terminal E of multiplexer 72 is connected to (+) by switch 22, the multiplexer passes data between $IN_2$ and OUT (reset data). Thus, with CLEAR switch 22 normally biased to the ground position, as shown in FIG. 4, the multiplexer 72 supplies keyboard entered address data to latch 46; counter data are supplied to the latch during a reset.

During a reset, the output of counter 74 rapidly advances through all possible output data states between 0000 and 1111. The frequency of oscillator 64 is high enough to ensure that all output data states are generated during even a short closure of CLEAR switch 22. The output of counter 74 causes multiplexer 72, controlled by CLEAR switch 22 through line 43, to successively generate addresses corresponding to all storage locations in RAMs 34a and 34b. As the storage locations in the RAMs 34a and 34b are being successively addressed by the output of latch 46, a positive voltage is applied to CLEAR LINE 45 by switch 22 (FIG. 4). CLEAR LINE 45 is connected to clear terminals C of up/down counters 38a and 38b. The positive voltage on the CLEAR LINE 45 maintains the outputs of the counters 38a and 38b at zero at all times during successive, high speed addressing of RAMs 34a and 34b, whereby the storage locations in the RAMs are successively reset to zero. Latch 46 does not latch onto any data generated by counter 74 through the multiplexer 72 because the latch is not enabled by pulse generator 100 connected to ENABLE terminal E of the latch. As discussed below, generator 100 enables the latch 46 for address data storage only if there is operation of a PLAY IDENTIFICATION switch 30, sensed by logic circuit 90. The CLEAR LINE 45 is also connected to CLEAR terminals C in counters 50a and 50b (FIG. 5) for resetting the contents of the counters (TOTAL POINTS GAINED/LOST) to zero.

As aforementioned, there are eight play identifications identified on PLAY IDENTIFICATION keys 30 shown in FIG. 1. This requires eight storage locations in RAM 34. However, data corresponding to points gained and lost for each play are stored in separate storage locations; 16 locations are thus required. Storage locations for points gained are distinguished from storage locations for points lost associated with particular plays with a DPDT switch 82, shown in FIG. 4. DPDT switch 82 includes a first member 84 and a second member 86 which are commonly controlled. Members 84 and 86 are indexed into an upper position as shown in FIG. 4, in response to an operation of GAIN key 26 (FIG. 1) and into a lower position in response to an operation of LOSS key 28. Switch member 86 controls the address on address line A, for example, as shown in FIG. 4, generated by encoder 44 through multiplexer 74. An inverter 88 is provided in address line A and is selectively bypassed by switch member 86.

When switch member 86 is in the lower, POINT LOST position, inverter 88 is "in circuit"; when switch member 86 is in the upper, POINT GAINED position, as shown, the inverter is bypassed. In correspondence with each selected play, therefore, one of two addresses is called for by latch 46 depending on the position of switch member 86. Stated another way, the lower three address lines B, C and D identify eight storage locations corresponding respectively to eight plays; the uppermost address line A, controlled by switch member 86, distinguishes between two distinct sets of eight storage locations into which points gained and lost are respectively stored.

Referring to FIG. 4, logic circuit 90 comprising NAND gates 92 and 94, two-input NOR gate 96 and inverter 98, in response to an operation of PLAY IDENTIFICATION switch 30, supplies a trigger signal to inputs of (1) a pulse generator of short-time-duration "one-shot" circuit 100, and (2) the long-time-duration KEEP ALIVE circuit 48. Any operation of a PLAY IDENTIFICATION switch 30 is detected by logic circuit 90 which supplies a positive signal to both of the inputs of (1) (2) above. The output of inverter 98 goes to a positive or "logic one" signal whenever there is a change of state on any of the four address lines A-D at the output of multiplexer 72, indicating that switch 30 has been operated. The "quiescent" state of multiplexer 72 provides logic one signals on each address line A-D. During each operation of a PLAY IDENTIFICATION switch 30, the output of the multiplexer 72 temporarily assumes the quiescent state, and then assumes the specified BCD address. Logic circuit 90 monitors address lines A-D, and causes the output of the inverter 98 to shift from ground potential (logic zero) to a positive potential (logic one) whenever the address on the lines changes from all logic ones (quiescent state of multiplexer 72) to any other address. Logic circuit 90 is thus a "logic zero on any address line" detector.

Circuit 100 supplies a short duration pulse to the enable inputs E of latch 46 causing the latch 46 to accept data generated by multiplexer 72 and store the data at the output terminals of the latch. Accordingly, each time PLAY IDENTIFICATION switch 30 is operated to identify a new play for which point data are to be stored, latch 46 stores the address data of the identified play for addressing RAM 34a and RAM 34b.

KEEP ALIVE circuit 48, triggered by logic circuit 90 through one input of NOR gate 108, generates a time delay signal of approximately six seconds to one input of NAND gate 56 (FIG. 3) along COUNT CONTROL line 47. KEEP ALIVE circuit 48 is alternatively triggered on by the POINT ENTRY switch 24. A signal generated by NAND gate 54b controlled by switch 24, is supplied to the remaining input of NOR gate 108. The output of NOR gate 108 is connected to trigger input T of monostable multivibrator 102.

The KEEP ALIVE signal supplied to NAND gate 56 permits the NAND gate to pass signals generated by POINT ENTER switch 24 through bounce eliminator 54 to the up/down counters 38. KEEP ALIVE circuit 48 also turns on display 16 with an enable signal supplied to displays 40 and 52 along DISPLAY ENABLE line 49. The 6 second time delay generated to KEEP ALIVE circuit 48 is sufficient to permit the user to enter several points into RAMs 34a and 34b by successively operating POINT ENTER switch 24, and to view display 16. At the end of the 6 second time delay, NAND gate 56 no longer passes signals generated by POINT ENTER switch 24 and display 16 turns off. If additional points are to be entered, however, the NAND gate 56 is reopened by readdressing the same storage location in RAMs 34a and 34b by redepressing the appropriate key 30 in FIG. 1, or by simply operating POINT ENTER key 24. Either operation also turns on display 16 for another time delay period. If desired, the time delay period can be increased in length by increasing the time constant of monostable multivibrator 102 within KEEP ALIVE circuit 48.

The output of inverter 98, controlled by logic circuit 90 in response to operation of any PLAY IDENTIFICATION switch 30, generates a preset signal that stores data contained in addressed storage locations of RAMs 34a and 34b and in up/down cuonters 38a and 38b. This stored data, as described above, is updated by POINT ENTER switch 24 and returned to the addressed storage locations. In order to ensure that counters 38a and 38b are preset slightly after a PLAY IDENTIFICATION switch 30 is operated, such that the appropriate storage locations in RAMs 34a and 34b are first addressed, a delay circuit 51 comprising inverters 51a, 51b and 51c, as well as NOR gate 51d, is provided for slightly delaying the signal on PRESET line 39. A preset signal on PRESET Line 39 is also generated by the KEEP ALIVE circuit 48, through inverter 51b of delay circuit 51. This causes the counters 38a and 38b to be preset to the contents of the addressed storage locations in RAMs 34a and 34b each time a POINT ENTER switch 24 is operated, as well as each time a PLAY IDENTIFICATION switch 30 is operated. The contents of the counters 38a and 38b are changed only if the POINT ENTER switch 24 is operated. This provision permits the contents of RAMs 34a and 34b to be displayed each time either the POINT ENTER switch 24 or a PLAY IDENTIFICATION switch 30 is operated.

Referring now to FIG. 5, points gained and lost are supplied to up/down counters 50a and 50b, each comprising three counter circuits connected in series through multiplexer 110. Control terminal C of multiplexer 110 is connected to switch member 84 of the switch 82 (FIG. 4) and transfers counts to either counter 50a or 50b depending on the position of the switch member 84. When switch member 84 is in the POINT GAIN position (FIG. 4) points generated by POINT ENTER switch 24 are supplied to the input of counter 50a. On the other hand, when switch member 86 is in the POINT LOST position, multiplexer 110 supplies point data to counter 56b. The counters 58a and 58b accumulate respectively total points gained and lost. Three digits of accumulated data are displayed on display screen 16 through units 52a and 52b driven by drivers 112a and 112b. The total points gained are displayed on the left-hand side of the screen 16 at portion 16c and the total points lost are displayed on the right hand side portion 16b. The opposite sides of the display screen are separated by portion 16a which is devoted to displaying points gained and lost for each play category. The latter are displayed by a common, two digit display 40a and 40b (FIG. 3).

At the end of a game, the total points gained are displayed by successively operating POINT ENTER key 24 and GAIN key 26. Operation of POINT ENTER switch 24 turns on KEEP ALIVE circuit 48 which generates a signal on the DISPLAY ENABLE LINE 49 as well as on the COUNT CONTROL line 47. Since no storage locations in RAMs 34a and 34b are addressed, the outputs of counter 50a are transferred to display units 52a thereby displaying total points gained. On the other hand, in order to display total points lost, the POINT ENTER key 24 and LOSS key 28 are successively operated whereby total points lost, stored in counter 50b, are displayed on display units 52b.

Points gained or lost in each play category are displayed by operating a desired PLAY IDENTIFICATION key 30 and then the GAIN key 26 or LOSS key 28, respectively. POINT ENTER key 24 is not operated. When a desired PLAY IDENTIFICATION key 30 is operated, latch 46 addresses corresponding storage locations in RAMs 34a and 34b for access. KEEP ALIVE switch 46 is activated by logic circuit 90 and the displays 40 are enabled by line 49.

The storage locations in RAMs 34a and 34b addressed are also determined by the position of GAIN/LOSS switch 82, controlled by keys 26 and 28 on keyboard 14. The addressed contents of RAMs 34a and 34b are thus displayed by display units 40a and 40b in portion 16a of screen 16. At the same time, the contents of either counter 112a or counter 112b are displayed by display unit 52a or unit 52b in screen portion 16c or 16a depending on the position of GAIN/LOSS switch 82. Thus, if points gained or lost in a play category are called for display by the user, total points gained or lost, respectively, are also displayed.

One method of operating storage device 10 by a player or spectator during an athletic event is summarized in FIG. 6. At the start of a game, the device 10 is turned on (step 112) using on/off switch 20 (FIG. 1). Following each play, a PLAY IDENTIFICATION key 30 is operated to indicate the type of play that was made (step 114). Then, a point is entered into storage device 10 through POINT ENTER key 24 (step 116). The point is identified as being either gained or lost using respectively key 26 or 28 (step 118). If necessary, (+)/(-) switch 32 is operated to indicate that a point is to be subtracted rather than added in storage (step 120), This procedure is repeated for each play.

at the end of the game, determined during step 122, points gained and points lost for each play category are recalled. This is done by operating a PLAY IDENTIFICATION key 30 (step 124) and operating GAIN key 26. The subtotal points gained in that play category are read from screen 16. In order to display subtotal of points lost in the same play category the same PLAY IDENTIFICATION key 30 is reoperated (step 128) followed by LOSS key 28 (step 130). Subtotal points lost are read from screen 16. This procedure may be repeated for each identified play. As described earlier, the circuit of device 10 is designed to display total points gained or lost as well as subtotal points gained or lost when the latter is called for. However, after the last play has been recalled (step 132) the total of the points gained, that is, the sum of all points gained in all play categories, may be separately displayed for compiling summary data by operating POINT ENTER key 24 (step 134) and then operating GAIN key 27 and reading total points gained in screen 16. Then, in order to display total points lost, POINT ENTER key 24 is operated (step 138) followed by LOSS key 28 (step 140), and total points lost are read from screen 16. Finally, the device 10 is turned off using switch 20 (step 142).

As discussed above, the data read out from storage device 10 can be used to evaluate a player's performance during each of several different plays, as well as his total performance. It is to be understood, however, that although the device 10 has been described in connection with performance evaluation associated with the game of tennis, the device could be used for evaluating player performance in any other game where points are gained and lost in association with different plays, i.e., the game of golf. With respect to the game of golf, PLAY IDENTIFICATION keys 30 may identify the different types of golf clubs used, and the qualitative keys 26 and 28 may represent "long" and "short". Additional keys associated with keys 26 and 28 may be provided identifying other qualitative data such as "left" and "right". If six different types of clubs are identified by keys 30, and four keys are provided identifying qualitative data, it is apparent that 24 storage locations must be provided in RAM 34. In general, NM storage locations are required where N = number of different plays available and M = number of different qualitative labels applied to performance.

It is furthermore apparent that the principles of the present invention can be applied to general applications wherein categorizable data are evaluated or any first set of data are correlated with a second set of data. Possible additional applications include quality control, wherein device 10 would be used to totalize various types of defects on an assembly line. For example, device 10 could be used to compile a list of defects as a function of manufactured parts. Other applications include time and motion studies wherein times for each of a plurality of operations are recorded. In expense analyses, expeiditures for each of a plurality of items or services could be stored in device 10 and later played out for evaluation. The device 10 could be used for making polls and surveys; the possibilities are endless.

It is also possible to apply the principles of the invention to providing correlation among three or more sets of variables (X, Y and Z) rather than between two sets of variables as has been described in the specification. For example, in inventory control, a first set of variables may represent package size, a second set may indicate merchandise having certain promotional incentives, and a third set may indicate how much shelf space is allocated. In the case of a 4 × 5 × 3 (X, Y and Z) matrix corresponding respectively to first, second and third variables, the result would be 62 pieces of information. Of these, 12 might be separate sums of the independent variables, e.g., 129 giant sized packages; 82 packages with reduced price offers; and 13 incidences where a size has a single shelf spacing. The remaining 60 pieces of information would be a synthesis of the three variables, e.g., 14 occasions where reduced price offers had two shelf spacings.

In this disclosure, there is shown and described only the preferred embodiment of the invention, but, as aforementioned, it is to be understood that the invention is capable of use in other combinations and environments and is capable of changes or modifications within the scope of the investive concept as expressed herein.

| COMPONENT | APPENDIX<br>COMMERCIAL IDENTIFICATION |
|---|---|
| RAMs 34 | 7489 |
| Counters 38 | 72192 |
| Multiplexer 42 | 74157 |
| BCD Encoder 44 | 74147 |
| Latch 46 | 7475 |
| Counters 50 | 74157 |
| Driver 62 | 9368 |
| Multiplexer 72 | 74192 |
| Multivibrator 102 | 74123 |

-continued

APPENDIX

| COMPONENT | COMMERCIAL IDENTIFICATION |
|---|---|
| Multiplexer 110 | 74157 |

What is claimed is:

1. An apparatus for logging categorizable data, comprising:
    keyboard entry means for generating categorizable first signals, and second signals associated with said first signals;
    addressable memory means containing a plurality of category storage locations;
    means responsive to said second signals for addressing said category storage locations in said memory means;
    means for storing said first signals in said memory means respectively in the category storage locations addressed by said second signals;
    means for combining said first signals in said category storage locations with any first signals previously stored in said locations;
    means controlled by said keyboard for recalling said combined first signals stored in selected ones of said category storage locations;
    means for visually displaying said recalled signals; and
    counter means responsive to said keyboard entry means for accumulating a total of said first signals keyboard entered into said plurality of category storage locations within said memory means.

2. The apparatus of claim 1, wherein said combining means includes logic means for selectively incrementing and decrementing previously stored first signals in said category locations by an amount determined by said keyboard entered first signals.

3. The apparatus of claim 1, further including means controlled by said keyboard means for recalling contents of said counter means; and means for visually displaying said recalled counter means contents.

4. The apparatus of claim 1, including means controlled by said keyboard means for clearing contents of all of said category storage locations within said addressable memory means.

5. The apparatus of claim 1, wherein said first signals include first and second signal data; said apparatus further including first and second counter means responsive to said keyboard entry means for accumulating respectively said first and second signal data, and means for displaying signals stored in said first and second counter means.

6. An athletic event performance indicating apparatus, comprising:
    keyboard means having keys representative of points played and play identifications;
    means responsive to operations of said point played and play identification keys for generating respectively point played and play identification signals;
    addressable memory means including a plurality of storage locations corresponding to plays identified on said play identification keys;
    means responsive to said play identification signal for addressing storage locations in said memory means corresponding to the plays identified by said play identification keys;
    means for storing said keyboard entered point played signals in said memory means in storage locations addressed respectively by said play identification signals;
    means for combining the keyboard entered point played signals being currently stored in the addressed storage locations with previously stored point played signals in said locations;
    means controlled by said keyboard for selectively visually displaying contents of said storage locations;
    wherein said keys representative of point played include a first key for generating a point gained signal and a second key for generating a point lost signal, said addressing means including means responsive to said point gained signal and point lost signal as well as to said play identification signal for addressing storage locations in said memory means; and
    first accumulator means responsive to said keyboard for accumulating a first signal indicative of a total of keyboard-entered points gained, and a second accumulator responsive to said keyboard for accumulating a second signal indicative of a total of keyboard-entered points lost.

7. The apparatus of claim 6, wherein said addressable memory means includes an electronic, addressable memory.

8. The apparatus of claim 6, wherein said combining means includes means controlled by said keyboard for incrementing said previously stored point signals by an amount corresponding to said currently keyboard-entered point signal in said addressed storage locations.

9. The apparatus of claim 8, wherein said combining means further includes means controlled by said keyboard for decrementing said previously stored point signal by an amount corresponding to said currently keyboard-entered point signal in said addressed storage locations.

10. The apparatus of claim 6, including means controlled by said keyboard for visually displaying contents of said first and second accumulator means.

11. The apparatus of claim 6, wherein said keyboard further includes a point enter key, said apparatus further including totaling means responsive to an operation of said point enter key for storing keyboard-entered play identification signals.

12. The apparatus of claim 11, including means for mounting said apparatus to the body of a player.

13. The apparatus of claim 11, wherein said memory means is energized by a battery operated power supply.

14. A method of analyzing performance in athletic events using an electronic data storage device having a keyboard and random access memory means controlled by said keyboard, said device further including keyboard controlled means for entering data identifying particular plays and data identifying point gained or point lost following each play, said memory means being capable of storing said point data in storage locations corresponding respectively to said particular play categories, comprising the steps of:
    (a) completing a play in an athletic event characterized by gaining or losing a point, the play being defined by a play category;
    (b) keyboard entering first data representing the play category;
    (c) addressing a storage location in said memory means corresponding to said play category using said first data;

(d) keyboard entering second data representing a point gained or point lost during play;
(e) storing said second data in said addressed storage location;
(f) combining said second data currently stored in said addressed storage location with any data previously stored in said addressed storage location;
(g) repeating steps (a) - (f) for each completed play during the athletic event;
(h) accessing said combined second data stored in selected ones of said storage locations to determine points lost and points gained for each play category; and
(i) displaying said accessed data.

15. A method of analyzing performances in athletic events using an electronic data storage device having random access memory means, comprising the steps of:
generating first signals identifying particular plays;
generating second signals representing evaluation data associated with said plays;
addressing storage locations in said memory means corresponding respectively to said first signals;
accumulating the second signals in the addressed storage locations;
accessing selected ones of the storage locations to read said second signals for determining accumulated evaluation data with respect to play categories associated with said storage locations;
determining evaluation data by accumulating said generated second signals in counter means;
accessing said accumulated signals stored in said counter means; and
displaying said accessed signals.

16. A method of analyzing performance in athletic events using an electronic data storage device having a keyboard and random access memory means controlled by said keyboard, said device further including keyboard controlled means for entering data identifying particular plays and data identifying evaluations respectively of said particular plays, said memory means being capable of storing said evaluation data in storage locations corresponding respectively to said particular plays, comprising the steps of:

keyboard entering first data representing a particular play;
addressing a storage location in said memory means corresponding to said particular play using said first data;
keyboard entering second data representing an evaluation of said particular play;
storing said second data in said addressed storage location;
combining said second data currently stored in said addressed storage location with any data previously stored in said addressed storage location;
accessing said combined second data stored in selected ones of said storage locations;
displaying said accessed data;
wherein the step of keyboard entering second data includes the step of keyboard entering point gained data and point lost data; and the step of addressing includes the step of accessing a storage location in said memory means corresponding to said particular play using said entered first data and also corresponding to one of the point gained and point lost data.

17. A method of compiling categorizable data using an electronic data storage device having a keyboard and random access memory means controlled by said keyboard, said device further including keyboard controlled means for entering first data; and second data categorized in terms of said first data, comprising the steps of:
keyboard entering the first data;
addressing a storage location in said memory means corresponding to said first data;
keyboard entering the second data;
storing the second data in said storage location addressed by said first data;
combining the currently stored second data with any second data previously stored in the addressed storage location;
accessing selected ones of said storage locations;
displaying contents of said accessed location;
accumulating said second data in counter means; and
displaying contents of said counter means.

* * * * *